(12) United States Patent
Tao et al.

(10) Patent No.: US 6,784,114 B1
(45) Date of Patent: Aug. 31, 2004

(54) MONATOMIC LAYER PASSIVATION OF SEMICONDUCTOR SURFACES

(75) Inventors: Meng Tao, Colleyville, TX (US); Wiley P. Kirk, Garland, TX (US)

(73) Assignee: Board of Regents The University of Texas System, Austin, TX (US)

(*) Notice: Subject to any disclaimer, the term of this patent is extended or adjusted under 35 U.S.C. 154(b) by 0 days.

(21) Appl. No.: 10/377,015

(22) Filed: Feb. 28, 2003

(51) Int. Cl.[7] .............................................. H01L 21/31
(52) U.S. Cl. ....................... 438/769; 438/910; 438/958
(58) Field of Search ................................. 438/765, 769, 438/778, 910, 958

(56) References Cited

U.S. PATENT DOCUMENTS

| | | | |
|---|---|---|---|
| 5,760,462 A | * 6/1998 | Barron et al. | 438/958 |
| 5,943,568 A | * 8/1999 | Fujii et al. | 438/240 |
| 6,483,172 B1 | * 11/2002 | Cote et al. | 257/639 |

OTHER PUBLICATIONS

R.M. Tromp, R.J. Hamers, and J.E. Demuth, Si(001) dimer structure observed with scanning tunneling microscopy, Phys. Rev. Lett., 1985, 1303, 55.

E. Kaxiras, Semiconductor–surface restoration by valence–mending absorbates: Application to Si(100):S and Si(100):Se, Physical Review B, 1991, 6324, 43.

H. Metzner, TH. Haln, and J.–H. Bremer, Structure of sulfur–terminated silicon surfaces, Surf. Sci., 1997, 377–379, pp. 71–74.

J.J. Boland, Structure of the H–saturated Si(100) surface, Phys. Rev. Lett., 1990, 3325, 65.

M. Tao and L.P. Hunt, The thermodynamic behavior of the Si–H system and its role in Si–CVD from $SiH_4$, J. Electrochem. Soc., 1992, 806, 139.

J.E. Northrup, Structure of Si(100)H: Dependence on the H chemical potential, Phys. Rev. B, 1991, 1419, 44.

B.S. Meyerson, F.J. Himpsel, and K.J. Uram, Bistable conditions for low–temperature silicon epitaxy, Appl. Phys. Lett., 1990, 1034, 57.

J.W. Lyding, T.–C. Shen, J.S. Hubacek, J.R. Tucker, and G.C. Abeln, Nanoscale patterning and oxidation of H–passivated Si(100)–2×1 surfaces with an ultrahigh vacuum scanning tunneling microscope, Appl. Phys. Lett., 1994, 2010, 64.

T.–C. Shen, C. Wang, G.C. Abeln, J.R. Tucker, J.W. Lyding, PH. Avouris, and R.E. Walkup, Atomic–scale desorption through electronic and vibrational excitation mechanisms, Science, 1995, 1590, 268.

(List continued on next page.)

Primary Examiner—Chandra Chaudhari
(74) Attorney, Agent, or Firm—Gardere Wynne Sewell LLP (57) ABSTRACT

The present invention relates generally to a method of improving the performance of solid state devices, and specifically provides methods for passivating a semiconductor surfaces with a monolayer of passivating material.

51 Claims, 4 Drawing Sheets

OTHER PUBLICATIONS

J.W. Lyding, UHV STM nanofabrication: progress, technology spin-offs, and challenges, Proceedings of the IEEE, 1997, 589, 85.

T.-C. Shen, C. Wang, and J.R. Tucker, Al nucleation on monohydride and bare Si (001) surfaces: atomic scale patterning, Phys. Rev. Lett., 1997, 1271, 78.

I. Lyubinetsky, Z. Dohnalek, W.J. Choyke, and J.T. Yates, Jr., $Cl_2$ dissociation on Si(100)–(2×1): A statistical study by scanning tunneling microscopy, Phys. Rev. B. 1998, 7950, 58.

M. Chander, Y.Z. Li, D. Rioux, and J.H. Weaver, Patterning of Si(100): Spontaneous etching with $Br_2$, Phys. Rev. Lett., 1993, 4154, 71.

The National Technology Roadmap for Semiconductors, Semiconductor Industry Association, 1997, pp. 1–126.

A. M. Cowley, S. M. Sze, Surface States and Barrier Height of Metal–Semiconductor Systems, J. Appl. Phys., 1965, 3212–3220, 36.

A. C. Papageorgopoulos, M. Kamaratos, Adsorption and desorption of Se on Si(100)S×1: surface restoration, Surf. Sci., 173–182.

Michaelson, Herbert B., The work function of the elements and its periodicity, J. Appl. Phys., 1977, 4729–33, 48.

* cited by examiner

MONATOMIC LAYER PASSIVATION OF SEMICONDUCTOR SURFACES

BACKGROUND OF THE INVENTION

Dangling bonds are an inherent nature of semiconductor surfaces. Such dangling bonds cause a variety of problems in the fabrication of solid-state devices on semiconductor substrates. They act as reaction sites for chemical reactions and create surface states that cause the observed properties of electronic devices to vary from their design specifications. On a semiconductor surface, dangling bonds adsorb oxygen, water, or carbon dioxide, and a layer of silicon dioxide (the so-called "native oxide") is formed as soon as the surface is exposed to air.

Figure 1:
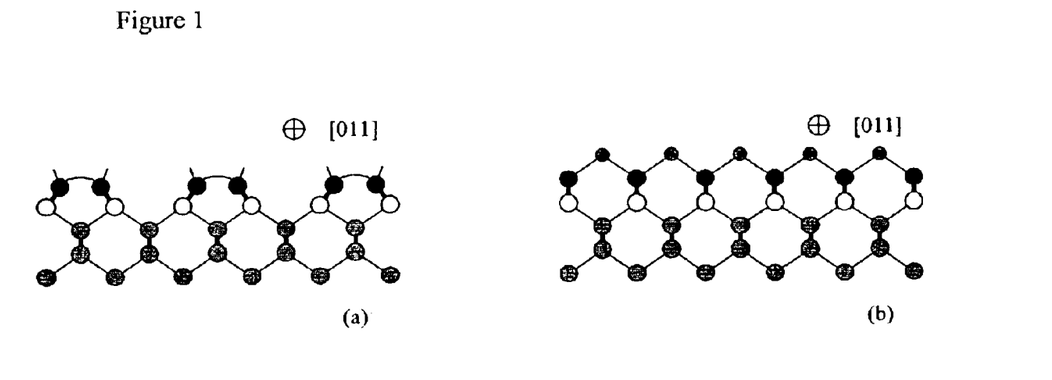
FIG. 1 depicts a side view into the [011] direction of (a) the reconstructed silicon(001) surface and (b) a Group VI-passivated silicon (001) surface. Dark Circles represent surface silicon atoms; white circles are second layer atoms and gray circles are bulk atoms.

When a clean silicon(001) surface is kept in ultrahigh vacuum, it has little chance for adsorption or reaction with external species. Under such conditions, the surface undergoes reconstruction to reduce its energy. Each atom on a reconstructed Si(001):2×1 surface has one dangling bond and shares a dimer bond with a neighboring surface atom, as shown in FIG. 1(a). Electronically, surface states originate from dangling bonds and strained surface bonds (i.e. dimer bonds and back bonds) and often pin the surface Fermi level, causing surface band bending. When a metal is deposited on the Si(001) surface, surface states (now more appropriately, interface states) pin the interface Fermi level, making the Schottky barrier height less dependent on metal work function and semiconductor electron affinity and instead, the barrier height is controlled by surface states.

The concept of "valence-mending" was proposed to eliminate dangling bonds on semiconductor surfaces. For the Si(001) surface, valence-mending atoms include Group VI atoms sulfur (S), selenium (Se) and tellurium (Te). They can bridge between two surface atoms and nicely terminate dangling bonds and relax strained bonds on Si(001), as shown in FIG. 1(b). This structure is often noted as a 1×1 reconstruction. The difficulty with valence mending is controlling the amount of passivating agent that is incorporated so that a new layer of material that significantly interferes with the intrinsic properties of the semiconductor substrate is not built up. Therefore, there exists a need for an effective method of passivating a semiconductor while concomitantly minimizing any carry over effects from the passivation itself.

SUMMARY OF THE INVENTION

The present invention provides an improved method for passivating a semiconductor surface.

In one form, the present invention is a method for passivating a semiconductor surface with a monolayer of passivating agent including the steps of placing a semiconductor substrate, having at least one surface, in a chamber and heating the semiconductor substrate to a temperature. The semiconductor substrate is then exposed to a passivating agent for a period of time sufficient to react with substantially all of the surface, and the partial pressure of the passivating agent is such that the passivating agent will not condense at the temperature of the substrate. As a result of this treatment the presence of surface states is greatly reduced.

In another form, the present invention is a method for manufacture of a semiconductor device with a low Schottky barrier including the steps of placing an n-type semiconductor substrate having at least one surface in a chamber and heating the semiconductor substrate to a temperature. The semiconductor substrate is then exposed to a passivating agent for a period of time sufficient to react with substantially all of the surface, and the partial pressure of the passivating agent is such that the passivating agent will not condense at the temperature of the substrate. As a result of this treatment the presence of surface states is greatly reduced. A portion of the semiconductor surface is then metallized with a metal having a work function whose magnitude is greater than the magnitude of the electron affinity of the semiconductor substrate.

In another form, the present invention is a method for manufacture of a semiconductor device with a low Schottky barrier including the steps of placing a p-type semiconductor substrate having at least one surface in a chamber and heating the semiconductor substrate to a temperature. The semiconductor substrate is then exposed to a passivating agent for a period of time sufficient to react with substantially all of the surface, and the partial pressure of the passivating agent is such that the passivating agent will not condense at the temperature of the substrate. As a result of this treatment the presence of surface states is greatly reduced. A portion of the semiconductor surface is then metallized with a metal having a work function whose magnitude is less than the sum of the magnitude of the electron affinity and the band gap of the semiconductor substrate.

Yet another form of the present invention is a method for manufacture of a semiconductor device with improved ohmic contacts comprising the steps of placing an n-type semiconductor substrate having at least one surface in a chamber and heating the semiconductor substrate to a temperature. The semiconductor substrate is then exposed to a passivating agent for a period of time sufficient to react with substantially all of the surface, and the partial pressure of the passivating agent is such that the passivating agent will not condense at the temperature of the substrate. As a result of this treatment the presence of surface states is greatly reduced. A portion of the semiconductor surface is then metallized with a metal having a work function whose magnitude is less than the magnitude of the electron affinity of the n-type semiconductor substrate.

Still another form of the present invention is a method for manufacture of a semiconductor device with improved ohmic contacts including the steps of placing an p-type semiconductor substrate having at least one surface in a chamber and heating the semiconductor substrate to a temperature. The semiconductor substrate is exposed to a passivating agent for a period of time sufficient to react with substantially all of the surface, and the partial pressure of the passivating agent is such that the passivating agent will not condense at the temperature of the substrate. As a result of this treatment the presence of surface states is greatly reduced. A portion of the semiconductor surface is then metallized with a metal having a work function whose magnitude is greater than the sum of the magnitude of the electron affinity and the band gap of the p-type semiconductor substrate.

Those skilled in the art will further appreciate the advantages and superior features of the passivation methods of the present invention upon reading the detailed description that follows in conjunction with the drawings.

DETAILED DESCRIPTION OF THE INVENTION

The invention, as defined by the claims, may be better understood by reference to the following detailed description. The description is meant to be read with reference to the figures contained herein. This detailed description relates to examples of the claimed subject matter for illustrative purposes, and is in no way meant to limit the scope of the invention.

Today, 95% of all semiconductor devices are field effect transistors (FET's). These are not the transistors, however, that Bardeen first demonstrated in 1947. The first example of a solid-state device was a point contact transistor that was less subject to the problems inherent in the formation of an FET. The difficulty in preparing an FET arose from problems caused by surface effects or surface states in the semiconductor material. The surface states were a direct result of dangling bonds on the surface of the semiconductor.

Various methods have been used over the years to attempt to reduce or passivate these surface states on semiconductor substrates that often impede the ability of solid-state devices to behave as they are designed. One such method is hydrogen passivation in which the dangling semiconductor bonds are converted to semiconductor-hydrogen bonds. This method suffers from steric problems due to the fact that there is insufficient room to break up the dimer bonds and fully hydrogenate the Si(001)surface. As a result, there are still surface effects that detract from the performance of any semiconductor devices ultimately formed on such a substrate.

Other methods of passivation that have been used include forming a thermal oxide layer on the semiconductor surface, and epitaxial growth of a lattice matched semiconductor on the surface of a compound semiconductor. While these methods do indeed deal somewhat with the dangling bond problem, they bring new issues to the table. Specifically, the surfaces treated in this way act more like the material that is built up on the surface than they do a pure semiconducting material.

The present invention provides, for example, a method for passivating the surface of a semiconductor surface without substantially altering the properties of the underlying material. As a result, solid-state devices may be prepared that have greatly lowered Schottky barriers, or alternatively, improved ohmic contacts.

The present invention involves the application of a passivating agent, also referred to as a passivant, under conditions that allow the passivant to react with a semiconductor surface but not to agglomerate or otherwise condense to form a thicker layer. This is accomplished by adjusting the temperature and pressure such that the partial pressure of the passivating agent is below the pressure at which it can condense. Under these conditions the passivant may react when it actually contacts the semiconductor substrate and in so doing forms a monolayer of material across the surface. Once the monolayer is complete no further reaction may take place. Since condensation is also precluded, the substrate may only exist in a monolayer passivated form.

Figure 2:
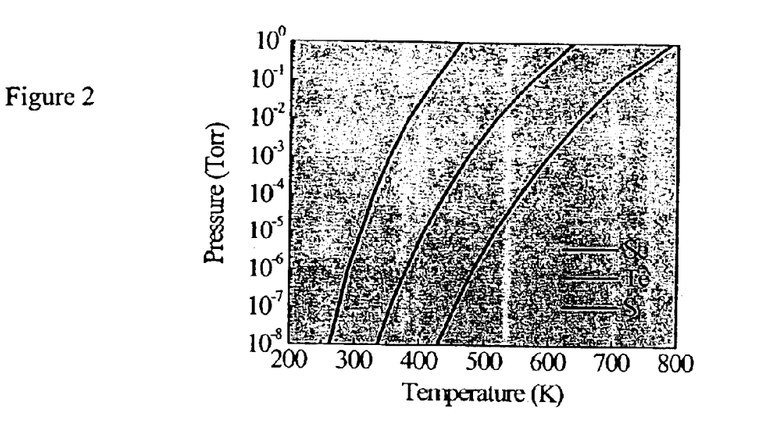
FIG. 2 depicts the phase behavior of tellurium, selenium and sulfur as a function of temperature and pressure.

FIG. 2 depicts the known condensation behavior of the Group VI elements, sulfur, selenium and tellurium as a function of pressure and temperature. The line for each element indicates where the condensed and vapor states of the element are in equilibrium with one another. Under conditions to the left of a chosen line in the plot, condensation will occur, and to the right of the same line, the element exists only in its vapor state. The present invention makes use of this data by using conditions where the element only exits in the vapor phase and allowing it to interact with a semiconductor substrate. The gaseous element may only be permanently removed from the vapor phase by contacting the surface and reacting with it. This is how monolayer passivation is accomplished.

The present invention may be used with a variety of passivants of varying valence. For example, the congeners of Groups VI in the periodic table may be used to passivate the Si(001) surface by bridging between surface atoms and eliminating dangling bonds, dimer bonds and strained back bonds. For other semiconductor morphologies such as steps, monovalent materials such as halogens of Group VII and hydrogen and its isotopes may be used in to passivate those areas of the semiconductor surface.

Figure 3:
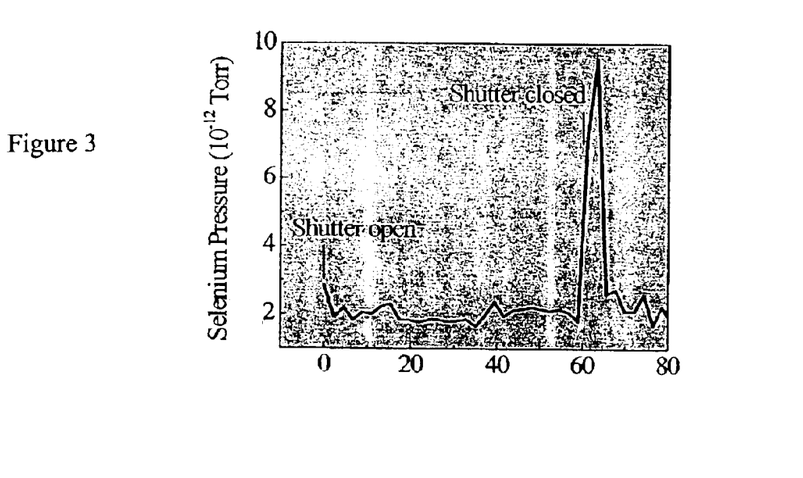
FIG. 3 depicts observed pressure of selenium during the passivation of silicon in accordance with the present invention.

FIG. 3 graphically depicts the fact that a passivant reacts with a semiconductor surface until all of the reaction sites are passivated. The shutter to a selenium source was opened at time 0 in the plot. The pressure of selenium in the reaction chamber remains low for approximately 60 seconds, indicating that the selenium is reacting with the surface and not building up in the reactor. At approximately 60 seconds, there is a spike in selenium pressure indicating that all of the reactive site on the surface of the silicon wafer have been passivated, and all additional selenium that is added is merely surplus and is building up as a gas in the reaction chamber.

Before the use of the present invention, no metal-semiconductor interface has been observed to have a Schottky barrier of less than 0.4 electron volts on n-type silicon. The formation of contacts on semiconductor surfaces that have been passivated in accordance with the present invention display markedly lower Schottky barriers. For example, the reported values for the Schottky barriers of aluminum silicon contacts are 0.7 electron volts. Al—Si contacts in accordance with the present invention have Schottky barriers of 0.06 to 0.1 electron volts, which are much closer to the theoretical value of −0.01 electron volts than previously observed. Similarly, chromium-silicon contacts have been reported to have Schottky barriers of 0.61 electron volts. However, when Cr—Si contacts are prepared in accordance with the present invention the observed barrier is 0.25 electron volts, which is very close to the theoretical barrier height of 0.21 electron volts.

The present invention may also be used to prepare ohmic contacts. An ohmic contact is in essence, a contact with a negative Schottky barrier, or put another way, no Schottky barrier at all. Both magnesium and titanium contacts with silicon have been reported to display Schottky barriers. When these contacts are prepared on surfaces that have been passivated in accordance with the present invention, they become ohmic, i.e. they display no barriers. This is demonstrative of the powerful effects of surface states and the desirability of removing such states from surfaces on which solid-state devices are constructed.

PREPARATIVE EXAMPLES n-type Silicon (001) wafers were used with antimony doping levels in the low $10^{15}$ cm$^{-3}$. The nominal wafer miscut was less than 0.5°. The selenium passivation experiments were performed in two molecular beam epitaxy (MBE) systems connected through an ultrahigh vacuum transfer tube. One of them was for silicon growth and the other for selenium passivation. The wafers were cleaned in 2% hydrofluoric acid for 30 seconds before loaded into the silicon MBE system. Silicon buffer layers of 500 Å with residual antimony doping levels of mid-$10^{14}$ cm$^{-3}$ were grown at 600° C. and then annealed at 800° C. for 1 hour. Sharp 2×1 reconstruction was always obtained with reflection high-energy electron diffraction after annealing. Some wafers were unloaded after silicon buffer growth. Other wafers were transferred to the selenium MBE system for passivation. The selenium source temperature was 224° C., the passivation time was 60 seconds, and the silicon wafer temperature was 300° C. Under the conditions described, precisely one monolayer of Se was deposited on the Si(001) surface.

After passivation, magnesium-silicon contacts were fabricated by electron-beam evaporation and lift-off on selenium-passivated wafers without any cleaning, and the magnesium dots were approximately 290 µm in diameter. Magnesium-silicon contacts were also fabricated on silicon wafers with 500 Å silicon buffer but without selenium passivation. These wafers were cleaned in 2% hydrofluoric acid for 30 seconds, which resulted in a hydrogen (H) passivated surface. Annealing of the magnesium-silicon contacts was performed with rapid thermal annealing and hot plate.

Figure 4:
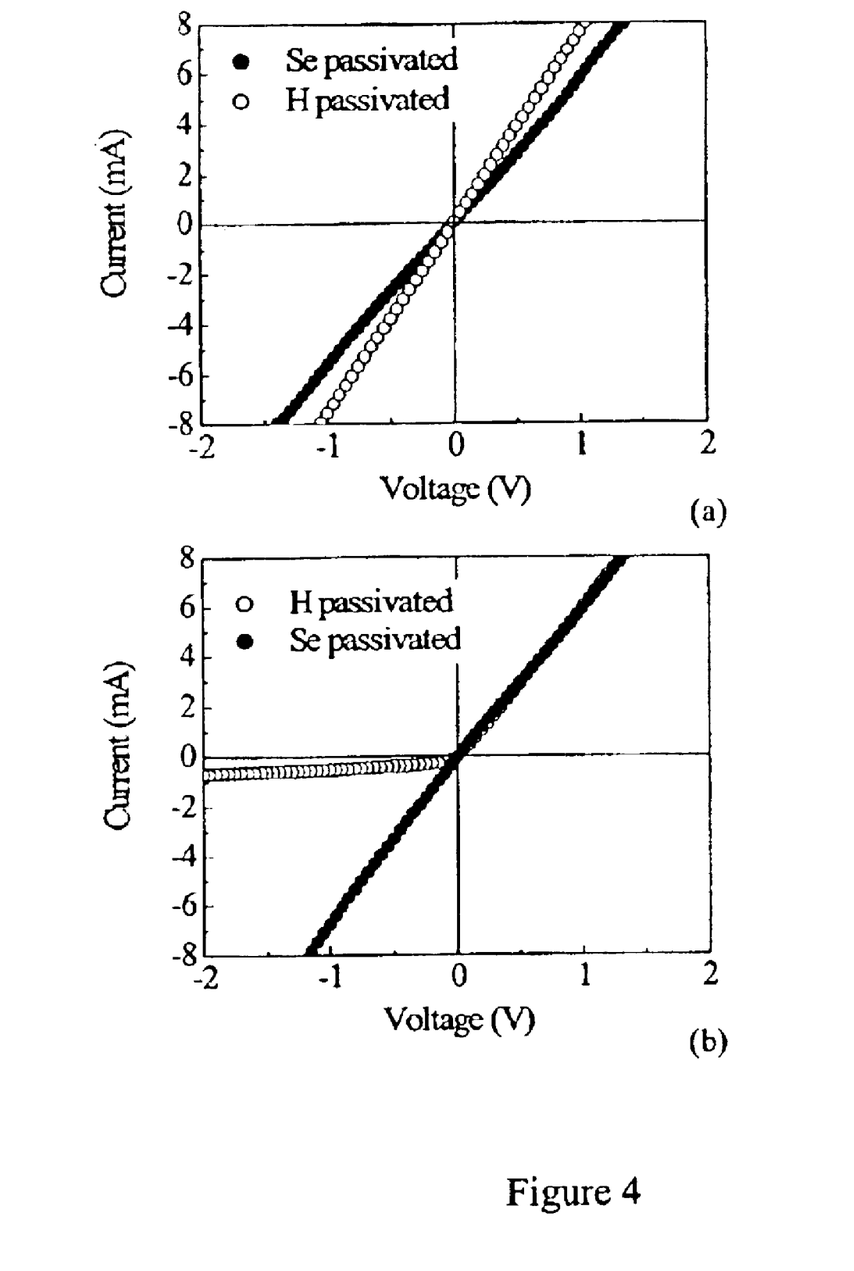
FIG. 4 is a Current-Voltage characteristics of (a) as-deposited magnesium contacts and (b) annealed magnesium contacts at 300° C. in $N_2$ for 30 seconds.

Magnesium is known to form a Schottky contact with n-type Si(001) with a barrier height of 0.4 eV. FIG. 4(a) shows the current-voltage (I–V) characteristics of as-deposited magnesium contacts on hydrogen-passivated and selenium-passivated Si(001), both of which behave in an ohmic fashion. In fact, ohmic behavior is observed for magnesium contacts on hydrogen-passivated and selenium-passivated Si(001) with n-type doping levels from low $10^{14}$ cm$^{-3}$ to high $10^{18}$ cm$^{-3}$.

Figure 5:
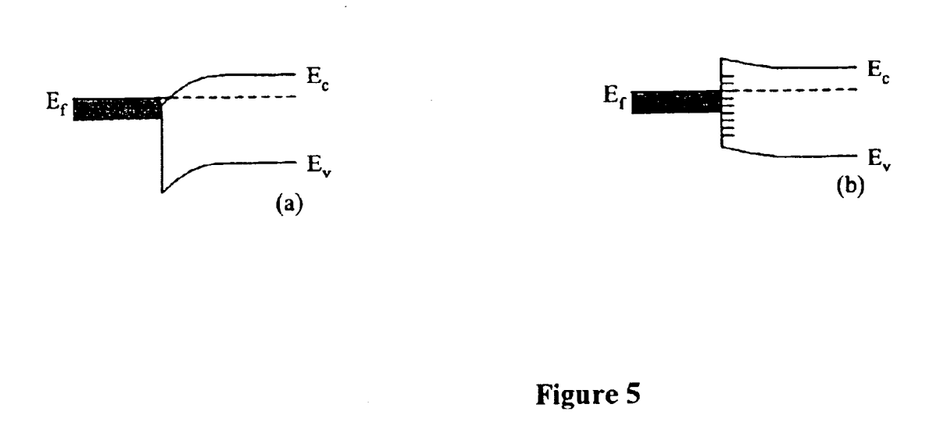
FIG. 5 is a Band diagram of magnesium-silicon contacts. (a) Without interface states and (b) with interface states.

The work function, $\phi$, of Mg is 3.66 eV, and the electron affinity, $\chi$, of Si is 4.05 eV. The ideal Schottky barrier height, $\phi_B$, for a Mg—Si contact free of interface states is $\phi_B = \phi - \chi$, which results in a negative barrier height of −0.39 eV. The negative sign simply means that there is no energy barrier between magnesium and silicon, as shown in FIG. 5(a). In reality, interface states often pin the interface Fermi level, consistent with the band diagram in FIG. 5(b). Several metals, including most of the Groups I and II elements, can have the band diagram shown in FIG. 5(a) with silicon, if only their work functions are considered. However, interface states are so dominant in these materials that such behavior is typically not observed.

Ohmic behavior is expected for the band diagram in FIG. 5. For electrons drifting from Mg to Si in FIG. 3(a), there is a small energy hump that is typically less than a few tenths of an electron volt. Once the applied voltage exceeds it, the contact becomes completely ohmic. In many cases, they behave perfectly ohmic.

Ohmic behavior is also observed for magnesium contacts on hydrogen-passivated Si(001), as shown in FIG. 4(a). It is believed that hydrogen passivation also reduces surface states and produces the band diagram in FIG. 5(a). The behavior of these samples after annealing is noteworthy. FIG. 4(b) shows the I–V characteristics of Mg contacts on hydrogen-passivated and Se-passivated Si(001) after rapid thermal annealing at 300° C. for 30 seconds in a nitrogen ambient. While the selenium-passivated sample remains ohmic, the hydrogen-passivated sample turns into a Schottky contact. Selenium passivation produces a more stable surface than hydrogen passivation. This is significant because a number of annealing steps are oftened required in the manufacture of complex semiconductor devices.

A first-principle analysis of surface energetics, accomplished by counting dangling bonds and taking into account bond dissociation energies, indicates that the selenium-passivated Si(001):1×1 surface in FIG. 1(b) is 2.1×10$^{-4}$ cal/cm$^2$ lower in energy than the hydrogen-passivated Si(001):2×1. It is likely that H passivation breaks down and Mg reacts with Si to form magnesium silicide (Mg$_2$Si) at 300° C. A Schottky contact is then formed between Si and Mg$_2$Si. For the Se-passivated sample, silicide formation is suppressed and the interface remains a Mg—Si one at 300° C.

Figure 6:
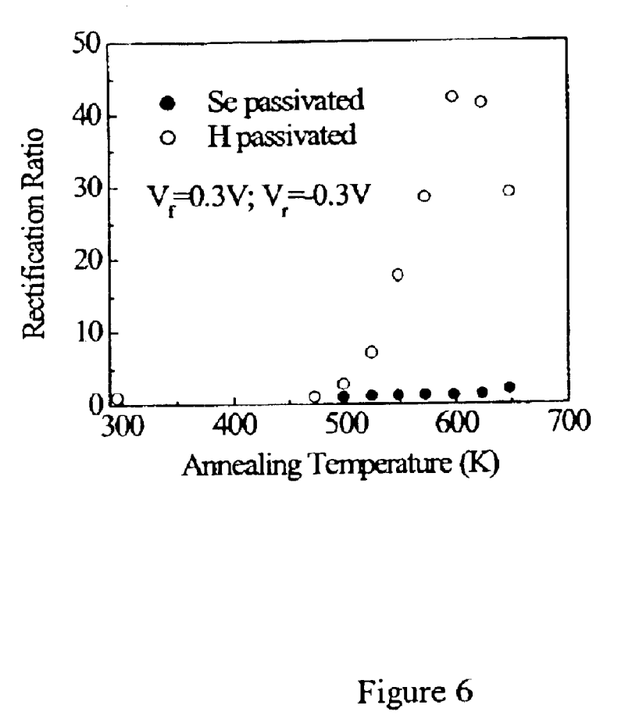
FIG. 6 is a Rectification ratio ($I_f/I_r$ at V±0.3 V) as a function of annealing temperature for Hydrogen-passivated and Selenium-passivated Si(001).

To quantify the transition from ohmic to Schottky, the rectification ratio, i.e. the ratio of the forward current, $I_f$, at $V_f$=0.3 V and the reverse current, $I_r$, at $V_r$=0.3 V is plotted as a function of hot-plate annealing temperature in FIG. 6 for both hydrogen-passivated and selenium-passivated Si(001) samples. On these samples the magnesium contacts are capped with 500 Å nickel (Ni) to prevent magnesium oxidation during annealing. The ratio for hydrogen-passivated samples starts to rise rapidly from ~1 at ~225° C. (500 K) and saturates to ~40 at ~325° C. (600 K). For the selenium-passivated sample, the ratio stays at ~1 even at 375° C. (650 K). Annealing above 375° C. is difficult because even the nickel-magnesium contacts get oxidized above that temperature. It is believed that, when the annealing temperature is high enough, magnesium and selenium-passivated Si(001) will eventually react to form Mg$_2$Si, and its rectification ratio will eventually increase to a value comparable to 40. If the middle point of the rectification ratio, 20, is defined as the transition temperature from ohmic to Schottky, selenium-passivated Si(001) has a transition temperature that is more than 100° C. higher than that of hydrogen-passivated Si(001) in FIG. 6.

What is claimed is:

1. A method for passivating a semiconductor surface with a monolayer of passivating agent comprising the steps of:
   placing a semiconductor substrate having at least one surface in a chamber;
   heating the semiconductor substrate to a temperature; and
   exposing the semiconductor substrate to a passivating agent for a period of time sufficient to react with substantially all of the surface, wherein the partial pressure of the passivating agent is such that the passivating agent will not condense at the temperature of the substrate, and the existence of surface states substantially eliminated.

2. The method of claim 1, wherein the chamber is part of a molecular beam epitaxy apparatus.

3. The method of claim 1, wherein the chamber is part of a chemical vapor deposition apparatus.

4. The method of claim 1, where the semiconductor substrate is chosen from the group consisting of silicon, germanium, silicon-germanium and silicon-carbide.

5. The method of claim 1, wherein the surface is the 001 surface of silicon.

6. The method of claim 1, wherein the passivating agent is chosen from the group consisting of Group VI and Group VII elements.

7. The method of claim 1, wherein the passivating agent is selenium.

8. A method for manufacture of a semiconductor device with a low Schottky barrier comprising the steps of:
placing a n-type semiconductor substrate having at least one surface in a chamber;
heating the semiconductor substrate to a temperature;
exposing the semiconductor substrate to a passivating agent for a period of time sufficient to react with substantially all of the surface, wherein the partial pressure of the passivating agent is such that the passivating agent will not condense at the temperature of the substrate, and the existence of surface states is substantially eliminated; and
metallizing a portion of the semiconductor surface with a metal having a work function whose magnitude is greater than the magnitude of the electron affinity of the semiconductor substrate.

9. The method of claim 8, wherein the chamber is part of a molecular beam epitaxy apparatus.

10. The method of claim 8, wherein the chamber is part of a chemical vapor deposition apparatus.

11. The method of claim 8, wherein the metal is aluminum.

12. The method of claim 8, wherein the metallizing is accomplished via electron beam evaporation or sputtering.

13. The method of claim 8, wherein the metallizing is accomplished by lift-off or etching.

14. The method of claim 8, wherein the semiconductor is chosen from the group consisting of silicon, germanium, silicon-germanium and silicon-carbide.

15. The method of claim 8, wherein the surface is the 001 surface of silicon.

16. The method of claim 11, wherein the metallized aluminum is present as dots.

17. The method of claim 16, wherein the dots of aluminum are about 290 microns in diameter.

18. The method of claim 8, wherein the metal comprises chromium.

19. The method of claim 8, wherein the metal comprises nickel.

20. A method for manufacture of a semiconductor device with a low Schottky barrier comprising the steps of:
placing a p-type semiconductor substrate having at least one surface in a chamber;
heating the semiconductor substrate to a temperature;
exposing the semiconductor substrate to a passivating agent for a period of time sufficient to react with substantially all of the surface, wherein the partial pressure of the passivating agent is such that the passivating agent will not condense at the temperature of the substrate, and the existence of surface states is substantially eliminated; and
metallizing a portion of the semiconductor surface with a metal having a work function whose magnitude is less than the sum of the magnitude of the electron affinity and the band gap of the p-type semiconductor substrate.

21. The method of claim 20, wherein the chamber is part of a molecular beam epitaxy apparatus.

22. The method of claim 20, wherein the chamber is part of a chemical vapor deposition apparatus.

23. The method of claim 20, wherein the metal is cobalt.

24. The method of claim 20, wherein the metallizing is accomplished via electron beam evaporation or sputter.

25. The method of claim 20, wherein the metallizing is accomplished by lift-off or etching.

26. The method of claim 20, wherein the semiconductor is chosen from the group consisting of silicon, germanium, silicon-germanium and silicon-carbide.

27. The method of claim 20, wherein the surface is the (001) surface of silicon.

28. The method of claim 23, wherein the metallized cobalt is present as dots.

29. The method of claim 28, wherein the dots of cobalt are about 290 microns in diameter.

30. The method of claim 20, wherein the metal comprises nickel.

31. A method for manufacture of a semiconductor device with improved ohmic contacts comprising the steps of:
placing an n-type semiconductor substrate having at least one surface in a chamber;
heating the semiconductor substrate to a temperature;
exposing the semiconductor substrate to a passivating agent for a period of time sufficient to react with substantially all of the surface, wherein the partial pressure of the passivating agent is such that the passivating agent will not condense at the temperature of the substrate, and the presence of dangling bonds and dimer bonds on the surface is substantially eliminated; and
metallizing a portion of the semiconductor surface with a metal having a work function whose magnitude is less than the magnitude of the electron affinity of the n-type semiconductor substrate.

32. The method of claim 31, wherein the chamber is part of a molecular beam epitaxy apparatus.

33. The method of claim 31, wherein the chamber is part of a chemical vapor deposition apparatus.

34. The method of claim 31, wherein the metal is magnesium.

35. The method of claim 31, wherein the metallizing is accomplished via electron beam evaporation or sputter.

36. The method of claim 31, wherein the metallizing is accomplished by lift-off or etching.

37. The method of claim 31, wherein the semiconductor is chosen from the group consisting of silicon, germanium, silicon-germanium and silicon-carbide.

38. The method of claim 31, wherein the surface is the 001 surface of silicon.

39. The method of claim 34, wherein the metallized magnesium is present as dots.

40. The method of claim 39, wherein the dots of magnesium are about 290 microns in diameter.

41. The method of claim 31, wherein the metal comprises titanium.

42. A method for manufacture of a semiconductor device with improved ohmic contacts comprising the steps of:
placing an p-type semiconductor substrate having at least one surface in a chamber;
heating the semiconductor substrate to a temperature;
exposing the semiconductor substrate to a passivating agent for a period of time sufficient to react with substantially all of the surface, wherein the partial pressure of the passivating agent is such that the passivating agent will not condense at the temperature of the substrate, and the presence of dangling bonds and dimer bonds on the surface is substantially eliminated; and
metallizing a portion of the semiconductor surface with a metal having a work function whose magnitude is greater than the sum of the magnitude of the electron affinity and the band gap of the p-type semiconductor substrate.

43. The method of claim 42, wherein the chamber is part of a molecular beam epitaxy.

44. The method of claim 42, wherein the chamber is part of a chemical vapor deposition apparatus.

45. The method of claim 42, wherein the metal is platinum.

46. The method of claim 42, wherein the metallizing is accomplished via electron beam evaporation or sputter.

47. The method of claim 42, wherein the semiconductor is chosen from the group consisting of silicon, germanium, silicon-germanium and silicon-carbide.

48. The method of claim 42, wherein the surface is the 001 surface of silicon.

49. The method of claim 45, wherein the metallized platinum is present as dots.

50. The method of claim 49, wherein the dots of platinum are about 290 microns in diameter.

51. A method for forming a semiconductor device comprising the steps of:

placing a semiconductor substrate having at least one surface in a chamber;

heating the semiconductor substrate to a temperature;

exposing the semiconductor substrate to a passivating agent for a period of time sufficient to react with substantially all of the surface, wherein the partial pressure of the passivating agent is such that the passivating agent will not condense at the temperature of the substrate, and the existence of surface states substantially eliminated; and metallizing a portion of the semiconductor surface.

* * * * *